United States Patent [19]
Ward et al.

[11] Patent Number: 4,874,947
[45] Date of Patent: Oct. 17, 1989

[54] FOCUSED ION BEAM IMAGING AND PROCESS CONTROL

[75] Inventors: Billy W. Ward, Rockport; Michael L. Ward, Gloucester, both of Mass.

[73] Assignee: Micrion Corporation, Beverly, Mass.

[21] Appl. No.: 160,578

[22] Filed: Feb. 26, 1988

[51] Int. Cl.[4] .......................................... H01J 37/304
[52] U.S. Cl. ..................................... 250/309; 250/307; 250/492.2; 356/314; 156/626
[58] Field of Search ................... 250/309, 307, 492.21, 250/492.2; 356/314; 156/626

[56] References Cited

U.S. PATENT DOCUMENTS

| | | | |
|---|---|---|---|
| 3,644,044 | 2/1972 | Tolk et al. | 356/85 |
| 3,699,334 | 10/1972 | Cohen et al. | 250/49.5 TE |
| 3,767,925 | 10/1973 | Foley, Jr. et al. | 250/251 |
| 4,135,097 | 1/1979 | Forneris et al. | 250/492.21 |
| 4,393,311 | 7/1983 | Feldman et al. | 250/459.1 |
| 4,418,283 | 11/1983 | Trotel | 250/492.2 |
| 4,457,803 | 7/1984 | Takigawa | 156/626 |
| 4,463,255 | 7/1984 | Robertson et al. | 250/251 |
| 4,466,839 | 8/1984 | Dathe et al. | 148/1.5 |
| 4,479,060 | 10/1984 | Tamura et al. | 250/398 |
| 4,503,329 | 3/1985 | Yamaguchi et al. | 250/309 |
| 4,532,402 | 7/1985 | Overbeck | 219/121 LU |
| 4,633,084 | 12/1986 | Gruen et al. | 250/306 |
| 4,639,301 | 1/1987 | Doherty | 204/192.31 |
| 4,661,702 | 4/1987 | Welkie | 250/309 |

OTHER PUBLICATIONS

C. W. Magee et al., "Depth Profiling of Sodium in SiO$_2$ Films by Secondary Ion Mass Spectrometry," Appl. Phys. Lett., 33(2), Jul. 15, 1978, pp. 193–196.
I. S. T. Tsong et al., "Absolute Photon Yields in the Sputter-Induced Optical Emission Process," Appl. Phys. Lett., 33(12), Dec. 15, 1978, pp. 999–1002.
K. Wittmaack, "Primary-Ion Charge Compensation in SIMS Analysis of Insulators," J. Appl. Phys., 50(1), Jan. 1979, pp. 493–497.
R. Levi-Setti, "Secondary Electron and Ion Imaging In Scanning Ion Microscopy," Scanning Electron Microscopy, 1983, pp. 1–22.
A. Bayly et al., "High Resolution Scanning SIMS Using Liquid Metal Field-Ionization Sources," Scanning Electron Microscopy, 1983, pp. 23–29.
A. Wagner, "Application of Focused Ion Beams to Microlithography," Solid State Technology, May 1983, pp. 97–103.
C. Lu, "End Point Detection in Ion Milling Processes by Sputter-Induced Optical Emission Spectroscopy," J. Vac. Sci. Technol., Apr–Jun. 1984, pp. 481–484.
A. R. Waugh et al., "Application of Liquid Metal Ion Sources to SIMS," Vacuum, vol. 34, Nos. 1–2, pp. 103–106, 1984.
XINIX Inc., Product Literature, Etch Endpoint Controller System Model 1012, Jan. 1987.
Micrion Corp., Product Literature, Micrion DMOD Focused Ion Beam System, Nov., 1987.

*Primary Examiner*—Jack I. Berman
*Attorney, Agent, or Firm*—Lahive & Cockfield

[57] ABSTRACT

Ion beam machining apparatus which uses a focused ion beam to sputter particles from a target is disclosed. The beam is scanned over the target and photons emitted in response to the incidence of the beam on the target are analyzed to identify the different materials in the target and the location of these materials. Electrons are projected in a stream to the impingement site of the ion beam, in order to neutralize the charge produced by the beam and thereby stabilize the position of this site, and the photon detectors are isolated from any light emitted by the electron source.

22 Claims, 2 Drawing Sheets

FOCUSED ION BEAM IMAGING AND PROCESS CONTROL

BACKGROUND OF THE INVENTION

This invention relates generally to focused ion beam systems and relates, in particular, to a scanning focused ion beam system which incorporates a sputter induced photoemission detector.

Focused scanning ion beam systems are known in the art, and have been implemented in research and production settings for several years. Conventional applications of focused ion beam systems include ion beam lithography, ion beam microscopy, ion beam milling and deposition, and secondary ion mass spectroscopy (SIMS).

Prior Art SIMS systems are typically utilized for surface analysis of semiconductors and other substrates. SIMS devices include a central vacuum chamber which houses a secondary ion mass spectrometer and a source of ions. The ions can be electrostatically steered so as to impinge upon a substrate such as a semiconductor device or a biological target. When the ions strike the target, secondary ions are created from the surface atoms due to nuclear collision events. These ions are collected by the SIMS detection system and are analyzed to determine their mass, and thus their elemental composition.

In a number of conventional focused ion beam systems, the primary ion beam can be deflected to strike selected points on the sample for analysis of those points. Alternatively, the ion beam can be scanned in a raster fashion to create a mapping of the area being scanned. It is well known in the art that in order to obtain accurate results from a mass analyzer system utilizing charged particle optics, the target must remain at a fixed voltage. When the ion beam target is a semiconductor or an insulator, it can accumulate charge from the high energy primary ion beam and its electrical potential will become more positive. In particular, if excess positive charge accumulates on the target, the ion beam can be deflected from the intended trajectory or even fail to reach the target.

A number of techniques are known in the art to reduce this problem of charge accumulation on the ion beam target in SIMS and other focused ion beam systems. One such technique is electron beam charge neutralization. In electron beam charge neutralization, an electron beam impinges on the target at the same general spot as the primary ion beam. The electron current, energy and current density are adjusted to offset the charge induced by the ion beam until the surface voltage is fixed and stable. Unfortunately, this technique is sometimes unsuited for elemental analysis in production oriented ion beam devices, because frequent adjustments must be made, often at each new target site.

There accordingly exists a need for focused ion beam target analysis and mapping systems which yield accurate elemental identification regardless of positive charge accumulation on the target.

SIMS systems are also used for depth profiling, a technique in which a map of elements is created at various depths in the target. In this process, the primary ion beam is used to stimulate the surface ions for the SIMS detector and to ion mill, or sputter, the target. The ion beam in these depth profiling devices removes the surface layers of the target material in a controlled fashion. Then, a new SIMS map is created of the new surfaces at selected depths, until a cross-section of the area, or depth versus element profile, is generated.

Another important application of the SIMS technique, essentially a variant of depth profiling, utilizes a SIMS detector as an end of process, or endpoint, detection system. In this application, the SIMS detector is used to continuously monitor the surface of a sample composed of layers of different elements, such as aluminum and silicon, while the sample is being milled by the primary ion beam or other material removing device. The material removal operation continues, removing the topmost level and exposing lower levels to the SIMS detector, until the desired element or end point is exposed.

Conventional SIMS-based end of process detectors suffer from some significant deficiencies. One limitation is imposed by the extremely low secondary ion yield of certain elements. Such low yields render conventional SIMS-based endpoint detectors unsuitable for a number of important applications.

There accordingly exists a need for a system which can provide accurate and reliable end point detection even for target materials having low secondary ion yields.

It is thus an object of the invention to provide an improved focused ion beam system.

It is a further object of the invention to provide such a focused ion beam and detector system which can generate high resolution observations of spatial information.

It is another object of the invention to provide a focused ion beam and detector system for generating scanning ion images and mappings for a wide range of target materials.

It is still another object of the invention to provide a depth profiling system, for use with ion beam milling apparatus, which can provide accurate and reliable end point detection and process control in a variety of materials.

Other general and specific objects of the invention will in part be obvious and will in part appear hereinafter.

SUMMARY OF THE INVENTION

The above objects are achieved by the invention which provides ion beam machining apparatus including ion beam source elements for directing a fine-focus ion beam of sub-micron radius onto an impingement site on a target for sputtering particles from the target. The ion beam defines an axis of incidence onto the target, and the axis of incidence defines a Z-coordinate axis.

The invention also includes electron source elements for directing electrons onto the target for neutralizing charge produced on the target by the ion beam, thus stabilizing the ion beam relative to the target site. The invention further includes photon detector apparatus for detecting photons emitted in response to incidence of the ion beam on the target, and for generating photon detector signals representative of selected emission characteristics of the emitted photons.

The invention provides output modules in electrical circuit with the photon detector apparatus, for detecting, in response to the photon detector signals, transitions between different material constituents within the target, and for identifying, in response to detected transitions between different material constituents within the target, a z axis coordinate of the impingement site of the ion beam within the target.

Another aspect of the invention provides scanner elements for selectively deflecting the position of the impingement site on the target, along a raster pattern, the raster pattern defining an X-Y plane substantially perpendicular to the Z axis. This aspect of the invention also includes elements in electrical circuit with the scanner elements for generating position signals representative of X-Y coordinates of the impingement site relative to the X-Y plane.

In a further aspect of the invention, the electron source elements include electron gun apparatus for generating a beam of low energy electrons, and isolation elements for isolating the photon detector apparatus from light energy emitted from the electron gun appartus. The isolation elements include shutter elements, in association with the electron gun apparatus, for selectively inhibiting, during first time intervals, light energy emissions from the electron gun apparatus. The isolation elements also include photon detector control modules, in electrical circuit with the photon detector apparatus and with the shutter elements, for controlling intervals of operation of the photon detector apparatus to generate the photon detector signals during only the first time intervals.

Alternatively, the isolation elements include dispersion-limiting elements, in association with the electron gun apparatus, for collecting light energy produced by the electron gun apparatus and transmitting a limited dispersion light beam, and beam trap apparatus, in association with the dispersion-limiting elements, for absorbing light energy in the limited dispersion light beam.

In accordance with another aspect of the invention, photon yield enhancement elements are provided for increasing the flux of photons emitted in response to incidence by the ion beam on the target. The photon yield enhancement elements include gas delivery elements for directing a stream of photon yield enhancing gas onto the target. The photon yield enhancing elements include a source of oxygen gas.

In a further aspect of the invention, the scanner elements include scanner control modules for selectively (i) scanning the beam about a predetermined etching area boundary during first time intervals for outlining a predetermined etching area, and (ii) scanning the beam about the interior of the predetermined etching area during second time intervals. The output modules include output control modules in electrical circuit with the photon detector apparatus and the scanner control modules for inhibiting response of the output modules to photon detector signals generated during the first time intervals.

The invention can include plural photon detectors, each of the plural photon detectors respectively detecting photons having a selected range of wavelengths of associated light. In this aspect of the invention, the output modules include elements for comparing the photon detector signals generated by each of the plural photon detectors.

The invention also provides elements for detecting, in esponse to transitions in the photon detector signals, corresponding transitions between different material constituents within the target.

In another aspect of the invention, the output modules include imaging elements, responsive to the position signals and the photon detector signals, for (i) correlating respective ones of the position signals and the photon detector signals, and for (ii) generating an image of the target responsive to the position signals and the photon detector signals. The imaging elements can include microprocessors for executing selected logical operations on the position signals and the photon detector signals.

The invention also provides a method of applying an ion beam to etch a target, including the step of directing a fine-focus ion beam of sub-micron radius onto an impingement site on the target for sputtering particles from the target, the ion beam defining an axis of incidence onto the target, the axis of incidence defining a Z-coordinate axis. The method further includes the steps of directing electrons onto the target for neutralizing charge produced on the target by the ion beam for stabilizing the ion beam relative to the target site; utilizing a photon detector for detecting photons emitted in response to incidence of the ion beam on the target; generating photon detector signals representative of selected emission characteristics of the emitted photons; detecting, in response to the photon detector signals, transitions between different material constituents within the target; and identifying, in response to the step of detecting transitions between different material constituents within the target, a Z axis coordinate of the impingement site of the ion beam within the target.

The invention further includes the steps of selectively deflecting the position of the impingement site on the target, along a raster pattern, the raster pattern defining an X-Y plane substantially perpendicular to the Z axis, and generating position signals representative of the X-Y coordinates of the impingement site relative to the X-Y plane.

Another aspect of the invention includes the further steps of utilizing an electron gun to direct a beam of low energy electrons onto the target, and isolating the photon detector from light energy emitted from the electron gun.

The invention additionally provides an ion beam etching method including scanning the beam about a predetermined etching area boundary during first time intervals for outlining a predetermined etching area, scanning the beam about the interior of the predetermined etching area during second time intervals, and inhibiting response to the photon detector signals generated during the first time intervals.

A method for generating images of a target is also provided by the invention, including the steps of correlating respective ones of the position signals and the photon detector signals, and generating, in response to the correlating step, an image of the target.

The invention accordingly comprises steps and apparatus embodying features of construction, combinations of elements and arrangements of parts adapted to effect such steps, as exemplified in the following detailed disclosure, and the scope of the invention is indicated in the claims.

BRIEF DESCRIPTION OF THE DRAWINGS

For a fuller understanding of the nature and objects of the invention, reference should be made to the following detailed description and the accompanying drawings in which.

DESCRIPTION OF ILLUSTRATED EMBODIMENTS

Figure 1:
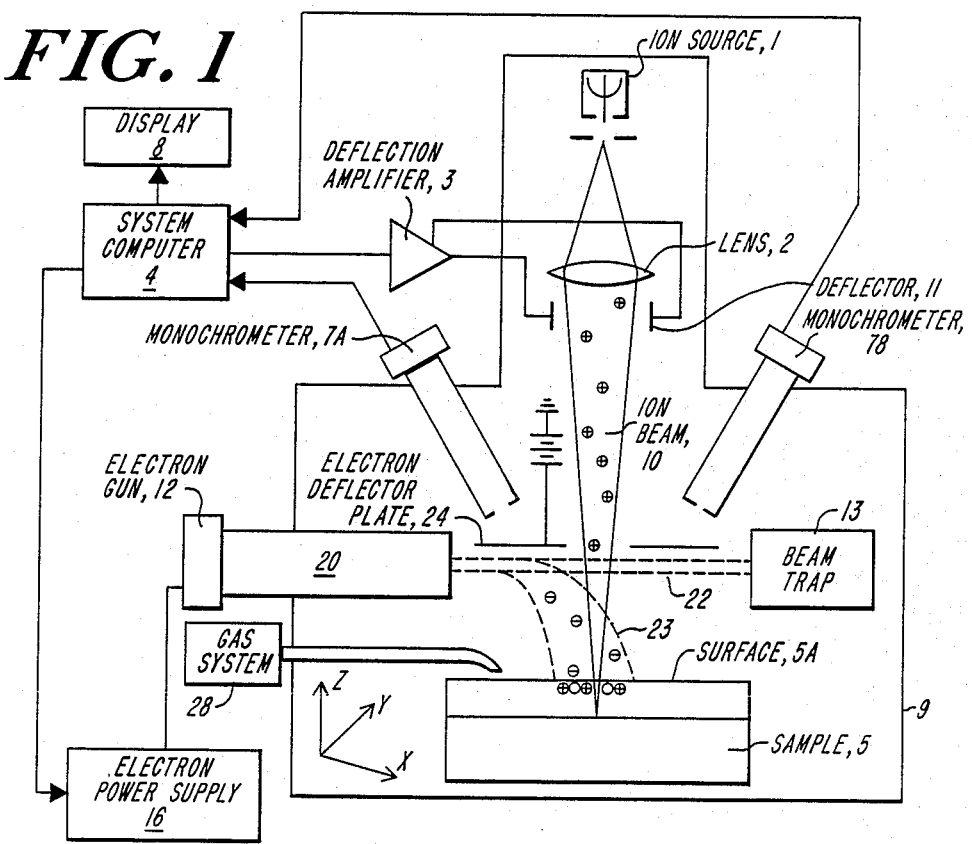
FIG. 1 is a schematic representation of ion beam apparatus according to the invention.

FIG. 1 depicts ion beam apparatus according to the invention. The apparatus includes an ion source 1 that provides ions focused by lens 2 to form a finely focused ion beam 10. Ion source 1 and lens 2 can be of conventional design and construction. Ion source 1, for example, is preferably a liquid metal ion source. An ion gun of this type is commercially available from Micrion Corp. of Beverly, Mass. The axis of ion beam 10 is deflected in a raster pattern along an X-Y plane by ion deflecting plates 11 to impinge at a selected impingement site upon the surface 5A of target 5. Ion deflecting plates 11 are controlled by X-Y position control signals generated by system computer 4. System computer 4 preferably controls deflecting plates 11 for directing beam 10 with sub-micron positional accuracy. As illustrated in FIG. 1, the axis of incidence of ion beam 10 defines a Z coordinate axis substantially perpendicular to the X-Y plane defined by the surface 5A of target 5. Target 5 may be, for example, a substrate composed of multiple alternating layers of aluminum (Al) and silicon (Si).

When the surface 5A is bombarded by focused ion beam 10, the ion beam causes the emission of secondary electrons, secondary ions, and sputtered neutral atoms, as well as sputtered molecules. Primary ions from beam 10 are implanted into surface 5A and also back scatter from surface 5A. Moreover, some of the sputtered ions are emitted from surface 5A in electronically excited states. These particles quickly decay, emitting photons of specific energies. Photons are also emitted by molecules and neutral atoms as a result of collision events involving ions from beam 10 striking surface 5A. Photon detectors 7A and 7B detect photons emitted in response to the incidence of ion beam 10 on surface 5A, to provide photon detector signals to the system computer 4.

The photon detectors 7A and 7B may be monochrometers of conventional design, constructed from components marketed by Ealing Electro-Optics of South Natick, Mass. In a preferred embodiment of the invention, detectors 7A and 7B are respectively adjusted to detect photons having different selected wavelengths of associated light. It is known in the art that ion bombardment of aluminum and silicon, for example, generates photon emissions of different characteristic wavelengths respectively corresponding to these elemental constituents.

Accordingly, a preferred embodiment of the invention utilizes a separate detector for detecting characteristic wavelengths of light resulting from ion bombardment of each elemental constituent. In the above example of aluminum and silicon layers, detectors having fixed bandwidth filters are preferably utilized, for detecting wavelengths of approximately 250 nanometers for silicon, and 307 nanometers for aluminum. Alternatively, a conventional spectrometer of the adjustable monochrometer type, responsive to a wide range of wavelengths, can be substituted for detectors 7A and 7B.

Those skilled in the art will appreciate that the apparatus illustrated in FIG. 1 utilizes photon imaging to provide high resolution topological and compositional information relating to the surface 5A beneath the focused ion beam 10. This information is useful for surface imaging, surface mapping, and for analyzing the elemental cross-section of sample 5. Thus, the system illustrated in FIG. 1 can be utilized to generate a high resolution scanning ion microscope map of the surface 5A of sample 5. Alternatively, system computer 4 can be utilized to generate a cross-section of sample 5 or to detect the end point of an ion beam sputtering process, typically by a sharp change in detected photon spectrum.

In a preferred embodiment of the invention, system computer 4 utilizes the photon detector signals generated by photon detectors 7A and 7B to detect transitions between different material constituents within the target, and to identify a Z axis coordinate of the impingement site of the ion beam 10 within the target 5. As the ion beam 10 etches away material on a target 5 composed of layers of aluminum and silicon, for example, layers of different elemental composition are exposed, resulting in photon emissions of different wavelengths. This is discussed in greater detail hereinafter in connection with FIG. 2. System computer 4 compares transitions in photon detector signals generated by photon detectors 7A and 7B to detect corresponding transitions between different material constituents within the target.

In a preferred embodiment of the invention, illustrated in FIG. 1, the system computer 4 correlates the deflection signals applied to ion beam deflector 11 with the signals received from detectors 7A and 7B so that system computer 4 can associate changes in photon detector signals with particular X-Y coordinates on the substrate surface 5A.

Those skilled in the art will appreciate that if sample 5 is a semiconductor or insulator, incident ion charge will accumulate on the target 5, creating an electric field that interferes with the potential of charged particles leaving the sample, rendering conventional electro-optical mass spectroscopic techniques used in SIMS applications unreliable and inaccurate.

Accordingly, an important feature of the invention is that it utilizes analysis of photons, emitted in esponse to an incident ion beam, which are unaffected by target charge accumulation.

Charge accumulation also interferes with ion beam position and configuration at the surface of the target, and can damage the target. Thus, in a preferred embodiment of the invention, the surface 5A surrounding the impingement site of ion beam 10 is bathed with electrons 23 from electron gun 12, in order to optimize the focus of and minimize position changes of the primary beam 10. The electrons emitted by electron gun 12 neutralize the positive charge of the incident ions of beam 10 and thereby reduce the undesired electric field produced by the positive ions.

As illustrated in FIG. 1, electron gun 12 receives power from power supply 16, which is controlled by control signals generated by system computer 4. Electron gun 12 produces a shower of electrons which are deflected by electron deflector plate 24 onto the target. Electron gun 12 may be a hot filament electron source of the type commercially available from Kimball Physics of Wilton, N.H. The electron gun 12 preferably delivers a current of between 10 nanoamperes and 1 microampere.

A hot electron source emits photons, as well as electrons, and can therefore affect the photon yield measured by detectors 7A and 7B. Thus, in a further preferred embodiment of the invention, undesired light 22 emitted by electron gun 12 is passed through a dispersion limiting device 20 mounted on the emitting end of electron gun 12. Dispersion limiter 20 may be, for example, a simple hollow tube. Light energy transmitted through such a tube emerges as a limited dispersion light beam 22. This limited dispersion beam 22 is directed to a beam trap apparatus 13, so that the photons 22 from the electron gun 12 do not interfere with the photon measurement process of detectors 7A and 7B.

In another embodiment of the invention, a shutter device (not shown in FIG. 1) is substituted for dispersion limiter 20. this shutter device is controlled by system computer 4 to block light energy emissions from the electron gun 12 during selected time intervals. The system computer 4 then reads the photon detector signals generated by photon detectors 7A and 7B during only these selected time intervals. Alternatively, a cold electron source, which generates no light, can be utilized in electron source 12.

In a further preferred embodiment of the invention, a gas delivery system 28 is provided for delivering a photon yield enhancing gas to the target 5. The gas delivery system 28 includes a source of photon enhancing gas, such as oxygen, valves for metering control, and a fine needle for conducting the gas to the target 5. Those skilled in SIMS systems will appreciate that, as in SIMS systems, selected gases such as oxygen will increase particle yield. In SIMS systems, such gases are used to increase ion yield. In accordance with the invention, however, photon enhancing gases such as oxygen are used to increase photon yield.

Figure 2:
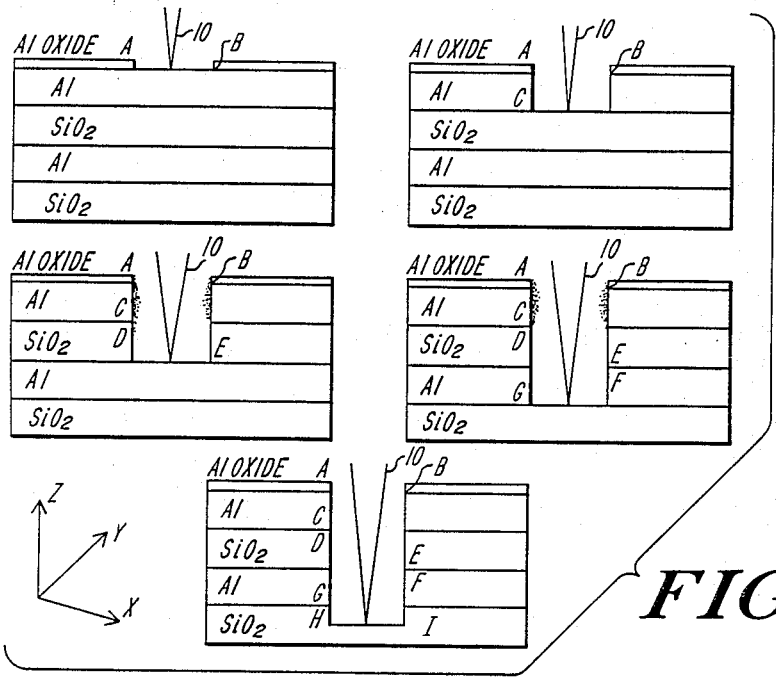
FIG. 2 depicts an aluminum/silicon substrate etched by an ion beam in accordance with the invention.
Figure 3A:
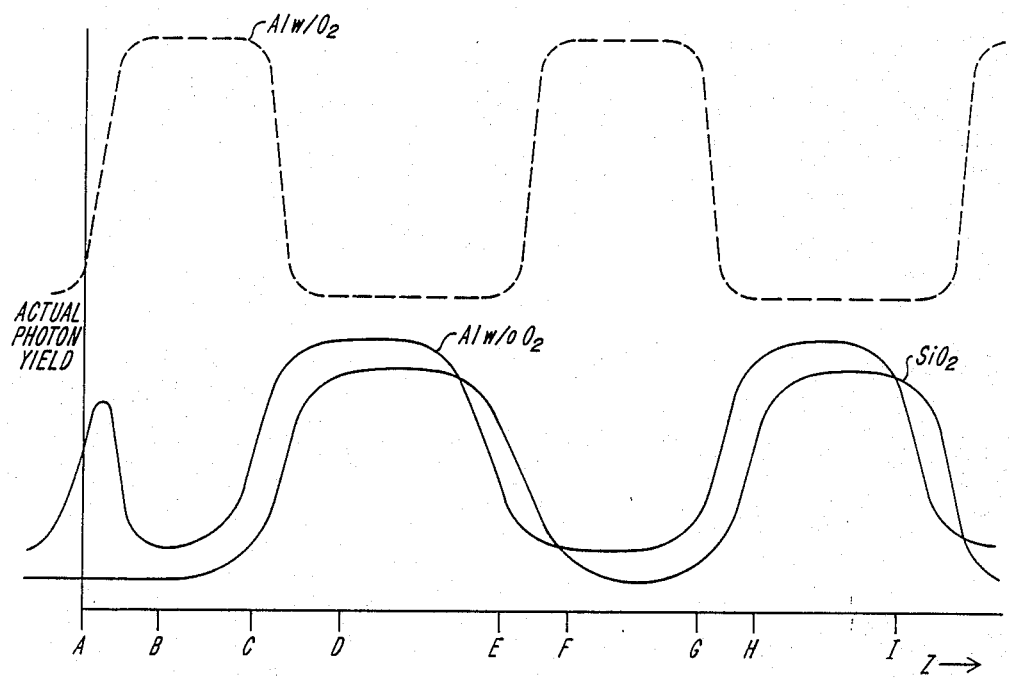
FIG. 3A depicts approximate actual detector outputs generated by the apparatus of FIG. 1 during etching of the substrate of FIG. 2.
Figure 3B:
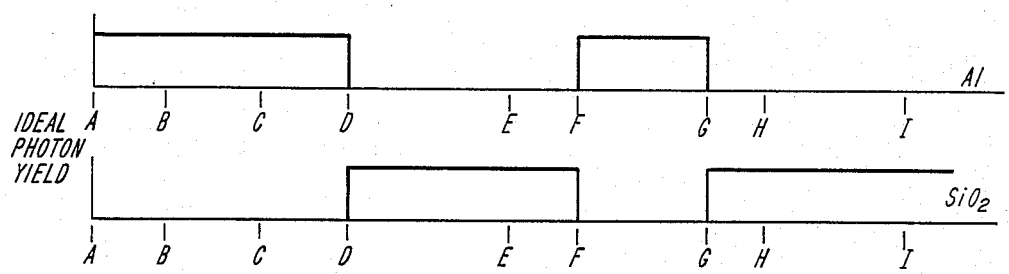
FIG. 3B depicts ideal detector outputs during etching of the substrate of FIG. 2.
Figure 4:
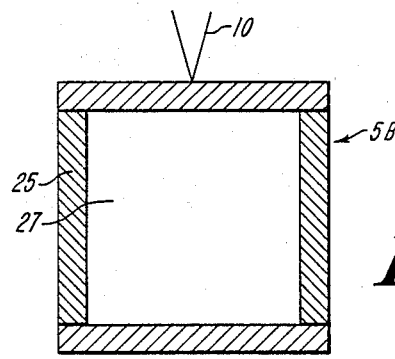
FIG. 4 is a schematic representation of a selected etching area, showing a "window" generated by the apparatus of FIG. 1.

The utilization of photon enhancing gas, such as oxygen, provides additional advantges, which are best explained in connection with FIGS. 2 and 3. FIG. 2 depicts, at five successive times, an aluminum/silicon substrate 5 etched by an ion beam 10 in accordance with the invention. The aluminum and silicon layers are denoted as A through H, with A being the surface layer. FIG. 3A is a graph of approximate actual detector outputs generated by detectors 7A and 7B (illustrated in FIG. 1) during etching of the substrate of FIG. 2. FIG. 3B is a graph of ideal or desired detector outputs which might be generated during etching of the substrate. The horizontal axis of FIGS. 3A and 3B corresponds with the Z-axis of FIG. 2. In particular, the left-to-right direction along FIGS. 3A and B represents increasing depth (Z-coordinate) in sample 5. System computer 4 (illustated in FIG. 1) can preferably generate on display 8 graphical information like that depicted in FIG. 3A.

FIG. 3B illustrates the ideal photon detector output corresponding to the substrate illustrated in FIG. 2. The ideal aluminum detector output, for example, indicates high levels of aluminum in the layers between points A and C, and between points F and G, accurately reflecting the presence of aluminum in these layers. Conversely, the ideal silicon detector output indicates high levels of silicon in layers between points D and E, and H and I.

Actual detector outputs, generated during etching in the absence of supplemental oxygen, as illustrated in FIG. 3A, differ from the ideal outputs. The silicon detector output accurately reflects the presence or absence of silicon in the various layers of substrate 5. The aluminum detector, however, indicates high levels of aluminum in the oxide layer between points A and B, but indicates rapidly decreasing levels of aluminum at point B, the starting point of the aluminum layer. Moreover, the aluminum detector indicates increasing yields of aluminum even when etching silicon layers.

This anomaly has several physical bases. First, the photon yield from pure elemental aluminum is significantly lower than that associated with aluminum oxide. The detector curve thus shows a pronounced drop when point B is reached. Additionally, when etching silicon layers, atoms of silicon oxide sputter up (as shown in FIG. 2 at points A–D) and oxidize the aluminum walls, dramatically increasing aluminum yields. Moreover, the ion beam does not have a sharp peripheral cutoff. Thus, when milling holes with high depth to width ratios, the edge of the beam continues to strike higher layers of aluminum even when milling silicon, increasing apparent aluminum yields. These effects are apparent at point C in FIG. 3A.

The above problems are overcome in a preferred embodiment of the invention, by utilizing the gas system 28 (illustrated in FIG. 1) for delivering a photon enhancing gas such as oxygen. By utilizing oxygen, the photon yield for all phases of aluminum etching is elevated, so that spurious increases in apparent aluminum yield caused by edge effects and oxidation from silicon oxide sputtering are less significant. As FIG. 3A indicates, the aluminum detector profile in the presence of oxygen thus approaches the ideal profile.

Accurate results can be generated even in the absence of oxygen, by careful attention to etching geometry. Thus, in a preferred embodiment of the invention, the ion beam is scanned in rectangular patterns around the periphery 25 of a selected region 5B of material removal. During this "window" mode of operation, the system computer 4 does not read the detector signals generated by the photon detectors. After the periphery 25 of the selected region 5B is etched, the interior 27 of the region 5B is etched, or "drilled." It is during this "drill" mode of operation that the system computer 4 reads the photon detector signals generated by the photon detectors to provide process control. This preferred embodiment of the invention provides accurate process control by obviating the prior art edge effect problem associated with machining holes with high depth to width ratios.

It will thus be seen that the invention efficiently attains the objects set forth above, among those made apparent from the preceding description. It will be understood that changes may be made in the above construction without departing from the scope of the invention. It is accordingly intended that all matter contained in the above description or shown in the accompanying drawings be interpreted as illustrative rather than in a limiting sense.

It is also to be understood that the following claims are intended to cover all of the generic and specific features as subscribed herein, and all statements of the scope of the invention, which, as a matter of language, might be said to fall therebetween.

Having described the invention, what is claimed as new and secured by Letters Patent is:

1. Ion beam machining apparatus comprising
   A. ion beam source means for directing a fine-focus ion beam onto an impingement site on a target for sputtering particles from the target, said ion beam defining an axis of incidence onto the target, said axis of incidence defining a Z-coordinate axis, B. electron source means for projecting a stream of electrons onto the target for neutralizing charge produced on the said ion beam relative to the target and maintain a selected sub-micron positional accuracy of said ion beam relative to the target, said electron source means having means for reducing emission of light energy, from said electron source means, which can impinge upon said photon detector means, C. photon detector means for detecting photons emitted in response to incidence of said ion beam on the target, and for generating photon detector signals representative of selected emission characteristics of said emitted photons, D. output means in electrical circuit with said photon detector means for detecting, in response to said photon detector signals, transitions between different material constituents within the target, and for identifying, in response to detected transitions between different material constituents within the target, a Z axis coordinate of the impingement site of said ion beam within the target, E. scanner means for selectively deflecting the position of the impingement site on the target, along a raster pattern, said raster pattern defining an X-Y plane substantially perpendicular to said Z axis, and F. means in electrical circuit with said scanner means for generating position signals representative of X-Y coordinates of the impingement site relative to said X-Y plane.

2. Apparatus according to claim 1, wherein said electron source means includes electron gun means for generating a beam of low energy electrons.

3. Appararatus according to claim 2 wherein said means for reducing emission comprises A. shutter means, in association with said electron gun means, for selectively inhibiting, during first time intervals, light energy emissions from said electron gun means, and B. photon detector control means, in electrical circuit with said photon detector means and with said shutter means, for controlling intervals of operation of said photon detector means to generate said photon detector signals during only said first time intervals.

4. Apparatus according to claim 2 wherein said means for reducing emission comprises A. dispersion limiting means, in association with said electron gun means, for collecting light energy produced by said electron gun means and transmitting a limited dispersion light beam, and B. beam trap means, in association with said dispersion limiting means, for absorbing light energy in said limited dispersion light beam.

5. Apparatus according to claim 1 further comprising

A. photon yield enhancement means for increasing the flux of photons emitted in response to incidence by the ion beam on the target, said photon yield enhancement means including gas delivery means for directing a stream of photon yield enhancing gas onto the target.

6. Apparatus according to claim 5 wherein said photon yield enhancing means includes a source of oxygen gas.

7. Apparatus according to claim 1 wherein

A. said scanner means includes scanner control means for selectively (i) scanning said beam about a predetermined etching area boundary during first time intervals for outlining a predetermined etching area, and (ii) scanning said beam about the interior of said predetermined etching area during second time intervals, and B. said output means includes output control means in electrical circuit with said photon detector means and said scanner control means for inhibiting response of said output means to photon detector signals generated during said first time intervals.

8. Apparatus according to claim 1 wherein

A. said photon detector means includes plural photon detectors, each of said plural photon detectors for respectively detecting photons having a selected range of wavelengths of associated light, and B. said output means includes means for comparing the photon detector signals generated by each of said plural photon detectors.

9. Apparatus according to claim 1 wherein said output means includes means for detecting, in response to transitions in said photon detector signals, corresponding transitions between different material constituents within the target.

10. Apparatus according to claim 1 wherein said output means includes imaging means, responsive to said position signals and said photon detector signals, for (i) correlating respective ones of said position signals and said photon detector signals, and for (ii) generating an image of the target responsive to said position signals and said photon detector signals.

11. Apparatus according to claim 10 wherein said imaging means includes microprocessor means for executing selected logical operations on said position signals and said photon detector signals.

12. A method of applying an ion beam to etch a target, comprising

A. directing a fine-focus ion beam onto an impingement site on a target for sputtering particles from the target, the ion beam defining an axis of incidence onto the target, said axis of incidence defining a Z-coordinate axis, B. utilizing an electron source to project a stream of electrons onto the target for neutralizing charge produced on the impingement site on the target by the ion beam, to stabilize said ion beam relative to the target and maintain a selected sub-micron positional accuracy of said ion beam relative to the target, C. utilizing a photon detector for detecting photons emitted in response to incidence of the ion beam on the target, D. reducing emission of light energy, from the electron source, which can impinge upon the photon detector, E. generating photon detector signals representative of selected emission characteristics of the emitted photons, F. detecting, in response to the photon detector signals, transitions between different material constituents within the target G. Identifying, in response to the step of detecting transitions between different material constituents within the target, a Z axis coordinate of the impingement site of said ion beam within the target, H. selectively deflecting the position of the impingement site on the target, along a raster pattern, the raster pattern defining an X-Y plane substantially perpendicular to said Z axis, and I. generating position signals representative of X-Y coordinates of the impingement site relative to said X-Y plane.

13. A method according to claim 12 comprising the further step of utilizing an electron gun to direct a beam of low energy electrons onto the target.

14. A method according to claim 13 wherein said reducing step comprises

A. selectively inhibiting, during first time intervals, light energy emissions from the electron gun, and B. generating the photon detector signals during only the first time intervals.

15. A method according to claim 13 wherein said reducing step comprises

A. collecting light energy produced by the electron gun to transmit a limited dispersion light beam, and B. absorbing light energy in the limited dispersion light beam.

16. A method according to claim 12 comprising the further step of

A. increasing the flux of photons emitted in response to incidence by the ion beam on the target, said increasing step including directing a stream of photon yield enhancing gas onto the target.

17. A method according to claim 16 wherein said increasing step includes directing a stream of oxygen onto the target.

18. A method according to claim 12 comprising the further steps of

A. scanning the beam about a predetermined etching area boundary during first time intervals for outlining a predetermined etching area, B. scanning the beam about the interior of the predetermined etching area during second time intervals, and C. inhibiting response to the photon detector signals generated during the first time intervals.

19. A method according to claim 12 comprising the further steps of

A. utlizing each of plural photon detectors for respectively detecting photons having a selected range of wavelengths of associated light, and B. comparing the photon detector signals generated by each of the plural photon detectors.

20. A method according to claim 12 comprising the further steps of detecting, in response to transitions in said photon detector signals, corresponding transitions between different material constituents within the target.

21. A method according to claim 12 comprising the further steps of

A. correlating respective ones of the position signals and the photon detector signals, and B. generating, in response to said correlating step, an image of the target.

22. A method according to claim 21 comprising the further step of utilizing a microprocessor for executing selected logical operations on the position signals and the photon detector signals.

* * * * *

UNITED STATES PATENT AND TRADEMARK OFFICE
CERTIFICATE OF CORRECTION

PATENT NO.    : 4,874,947
DATED         : October 17, 1989
INVENTOR(S)   : Billy W. Ward and Michael L. Ward It is certified that error appears in the above-identified patent and that said Letters Patent is hereby corrected as shown below:

Column 10, line 63, after "G.", please delete "Identifying" and insert --identifying--.

Signed and Sealed this

Thirteenth Day of April, 1993

Attest:

STEPHEN G. KUNIN

*Attesting Officer*          *Acting Commissioner of Patents and Trademarks*